United States Patent [19]

Turunen et al.

[11] Patent Number: 5,781,088
[45] Date of Patent: Jul. 14, 1998

[54] LUMPED-CONSTANT RESONATOR STRUCTURE AND METHOD FOR ADJUSTING IT

[75] Inventors: Aimo Turunen; Heli Jantunen, both of Oulu, Finland

[73] Assignee: ADC Solitra Oy, Kempele, Finland

[21] Appl. No.: 637,619
[22] PCT Filed: Nov. 1, 1994
[86] PCT No.: PCT/FI94/00489
 § 371 Date: Apr. 29, 1996
 § 102(e) Date: Apr. 29, 1996
[87] PCT Pub. No.: WO95/12903
 PCT Pub. Date: May 11, 1995

[30] Foreign Application Priority Data

Nov. 1, 1993 [FI] Finland ............... 934828

[51] Int. Cl.$^6$ ........................................... H03H 1/00
[52] U.S. Cl. .......................... 334/45; 333/185; 333/235; 334/71; 336/200
[58] Field of Search ................... 333/174, 185, 333/219, 235; 334/41, 45, 65, 71, 78

[56] References Cited

U.S. PATENT DOCUMENTS

| 4,603,311 | 7/1986 | Mage | 333/202 |
|---|---|---|---|
| 4,614,925 | 9/1986 | Kane | 333/174 |
| 4,757,286 | 7/1988 | Konishi et al. | 333/204 |
| 4,800,348 | 1/1989 | Rosar et al. | 333/202 |
| 4,801,904 | 1/1989 | Sakamoto et al. | 333/185 X |
| 4,821,005 | 4/1989 | Kling | 333/185 X |
| 4,963,844 | 10/1990 | Konishi et al. | 333/208 |

FOREIGN PATENT DOCUMENTS

| 2045540 | 10/1980 | United Kingdom . |
|---|---|---|
| 2079066 | 1/1982 | United Kingdom . |

*Primary Examiner*—Paul Gensler
*Attorney, Agent, or Firm*—Ladas & Parry

[57] ABSTRACT

The invention relates to a lumped-constant resonator construction, and a method for adjusting a lumped-constant resonator construction. The lumped-constant resonator construction comprises at least one, preferably ceramic substrate (4), at least one capacitance means (5), and at least one inductance means (6). The capacitance means and the inductance means (6) are clearly locatable separately but operatively connected. The inductance means (6) comprises a conductive coating (11). In the lumped-constant resonator construction according to the invention, the inductance means (6) which comprises the conductive coating (11) and which is locatable separately from the capacitance means (5) is provided on a preferably bar-like ceramic body (7) mounted on the substrate (4).

14 Claims, 2 Drawing Sheets

LUMPED-CONSTANT RESONATOR STRUCTURE AND METHOD FOR ADJUSTING IT

BACKGROUND OF THE INVENTION

The invention relates to a lumped-constant resonator construction comprising at least one, preferably ceramic substrate, at least one capacitance means, and at least one inductance means, said capacitance means and said inductance means being clearly locatable separately but operatively connected, said inductance means comprising a conductive coating.

The invention also relates to a method for adjusting a lumped-constant resonator construction, said method comprising altering the characteristics of one or more resonant circuits formed by one or more capacitance means and inductance means provided on one or more substrates, said capacitance means and inductance means of the resonator construction being clearly locatable separately but operatively connected, said inductance means comprising a conductive coating.

Resonator constructions are used for implementing high-frequency circuits for instance in mobile phones and their base stations. Resonators can be used, for example, as interface and filtering circuits in the output stages of amplifiers of mobile phones. If the resonator construction comprises several capacitance and inductance means, the resonant circuits are coupled to one another in such a manner that the resonator construction provides the desired frequency response in the frequency band.

The term lumped-constant resonator structure means that a capacitance means and an inductance means can be clearly located in a resonant circuit. Thus the lumped-constant resonator structure differs from other resonator types, such as coaxial resonators and micro-strip resonators, from which it is not possible to locate separate capacitance and inductance means. A lumped-constant resonator forms an LC oscillating circuit.

Lumped-constant resonators can be mounted, for instance, on a ceramic substrate, or base plate. Both a capacitance means and an inductance means are provided on the substrate. The capacitance means, i.e. in practice the capacitor, usually consists of electrodes provided on opposite sides of the substrate, and a substrate medium between them, such as zirconium-tin-titanate, the dielectric constant of which is high, i.e. about 36. In known lumped-constant resonators, the inductance means, in turn, has been implemented in a conventional way, i.e. with a wound coil. During the manufacture of resonators or apparatuses comprising resonators, and in the use of such apparatuses, resonators are often subjected to severe temperature conditions, for instance during soldering or rapid changes in the ambient conditions. A metallic thin-wired coil expands during heating, as a result of which the resonance frequency determined by the resonator construction drifts downwards. A significant further drawback in constructions with a wound coil is the possible rupture of the ceramic-metal-type joint between the ceramic substrate plate and the coil, since, as a result of temperature changes, the metallic coil expands, whereas the ceramic substrate does not. In the known solutions, the coil is secured to an electrode provided on the substrate in a conventional way, for example by tin solder. The soldering as such is a separate operation, and in addition, the solder must be purified by washing from the fluxes contained in the soldering tin. A significant problem with wound coils is the manufacture of particularly small coils, in which the laps of the coil should be precisely identical. Mounting of the coils on the base plate, or substrate, is an operation which also calls for particular accuracy.

Adjustment of a lumped-constant resonator is sometimes also problematic. If the resonance frequency of a circuit is to be adjusted in known lumped-constant resonators by adjusting the inductance, the winding of the coil must usually be changed; this is a difficult operation, which often requires that the entire coil be changed as long as it is economically sensible. In a construction comprising several resonant circuits, such as a filter, adjacent resonant circuits are connected to each other, i.e. their coupling is adjusted, so that the resonator construction formed by several resonant circuits provides the desired frequency response. In the known resonators, i.e. resonators provided with wound coils, the coupling between adjacent resonant circuits is adjusted by changing the distance between the resonant circuits, for instance by changing the distance between the coils of adjacent resonant circuits, which is a laborious and expensive operation.

Forming an inductance means from a conductive coating is known, for example, from GB 2 079 066, GB 2 045 540 and U.S. Pat. No. 4,614,925. However, the inductance means disclosed in these references are either provided directly on the surface of the substrate or complicated multi-layer constructions. U.S. Pat. No. 4,603,311, U.S. Pat. No. 4,757,286, and U.S. Pat. No. 4,963,844 disclose strip line resonators and waveguides comprising a coating provided on a block, the same coating providing both the capacitance and the inductance. However, the latter publications do not relate to lumped-constant resonators, in which both an inductance means and a capacitance means can be located.

SUMMARY OF THE INVENTION

The object of the present invention is to provide a new type of lumped-constant resonator construction, which avoids the problems associated with the known solutions.

This is achieved with a lumped-constant resonator construction according to the invention, which is characterized in that, in the lumped-constant resonator construction, the inductance means, which comprises the conductive coating and is locatable separately from the capacitance means, is provided on a bar-like, preferably ceramic body mounted on the substrate.

In order to achieve the above-mentioned objects, the method according to the invention for adjusting a lumped-constant resonator construction is characterized in that, in the lumped-constant resonator construction, the characteristics of a resonant circuit are altered by adjusting the amount, preferably the area, of the conductive coating which forms the inductance means and is provided on a bar-like, preferably ceramic body mounted on the substrate.

The lumped-constant resonator construction according to the invention and the method for adjusting it are based on the idea that inductance is realized as a thin conductive coating on a ceramic bar-like block mounted on a substrate, whereby the resonator can be adjusted by changing the coating, preferably by removing existing coating. In the invention, the coil is thus replaced with a highly conductive coating provided on a ceramic block; the coating may be, for example, a silver paint layer which is thin and covers a wide area.

The lumped-constant resonator construction of the invention has several advantages. No significant heat expansion takes place in the solution of the invention, and thus there is no drift of the resonance frequency, either. To provide the inductance by means of a coating on the body of the inductance means makes it possible to have a ceramic-ceramic-type joint between the body of the inductance means and the substrate, or base plate, of the resonator construction. No heat expansion takes place at such a joint, wherefore the joint does not rupture. The conductive coating, such as a layer of silver paint, on the inductance means can be utilized for securing the inductance means to the substrate, whereby the use of a conventional solder or soldering tin can be avoided. In the new type of joint, the connection area of the inductance means, i.e. the electrode, is connected to the conductive coating provided on the ceramic body of the inductance means by means of the conductive coating itself. This makes the joint extremely heat-resistant and allows the inductance means to be easily mounted. To provide the conductive coating on the body of the inductance means and to mount the inductance means on the substrate are easy operations as compared with the manufacture of a coil. The conductive coating also has smaller losses in electrical conductivity than a wound coil.

BRIEF DESCRIPTION OF THE DRAWINGS

In the following, the invention will be described in greater detail with reference accompanying drawings, in which.

DESCRIPTION OF EMBODIMENTS

Figure 2:
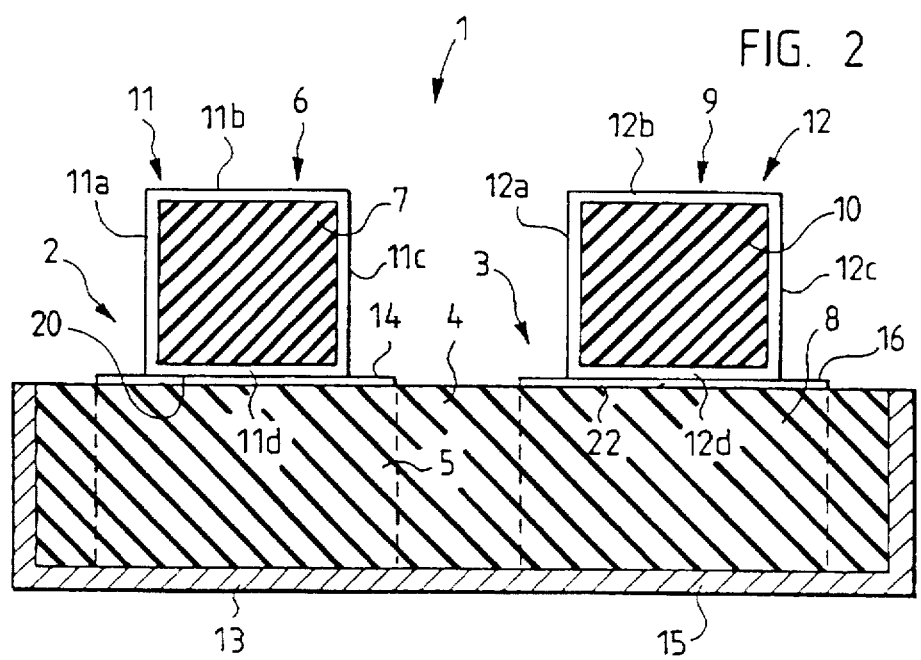
FIG. 2 is a cross-section of a resonator construction comprising two resonant circuits, taken from between arrows A in FIG. 1.
Figure 1:
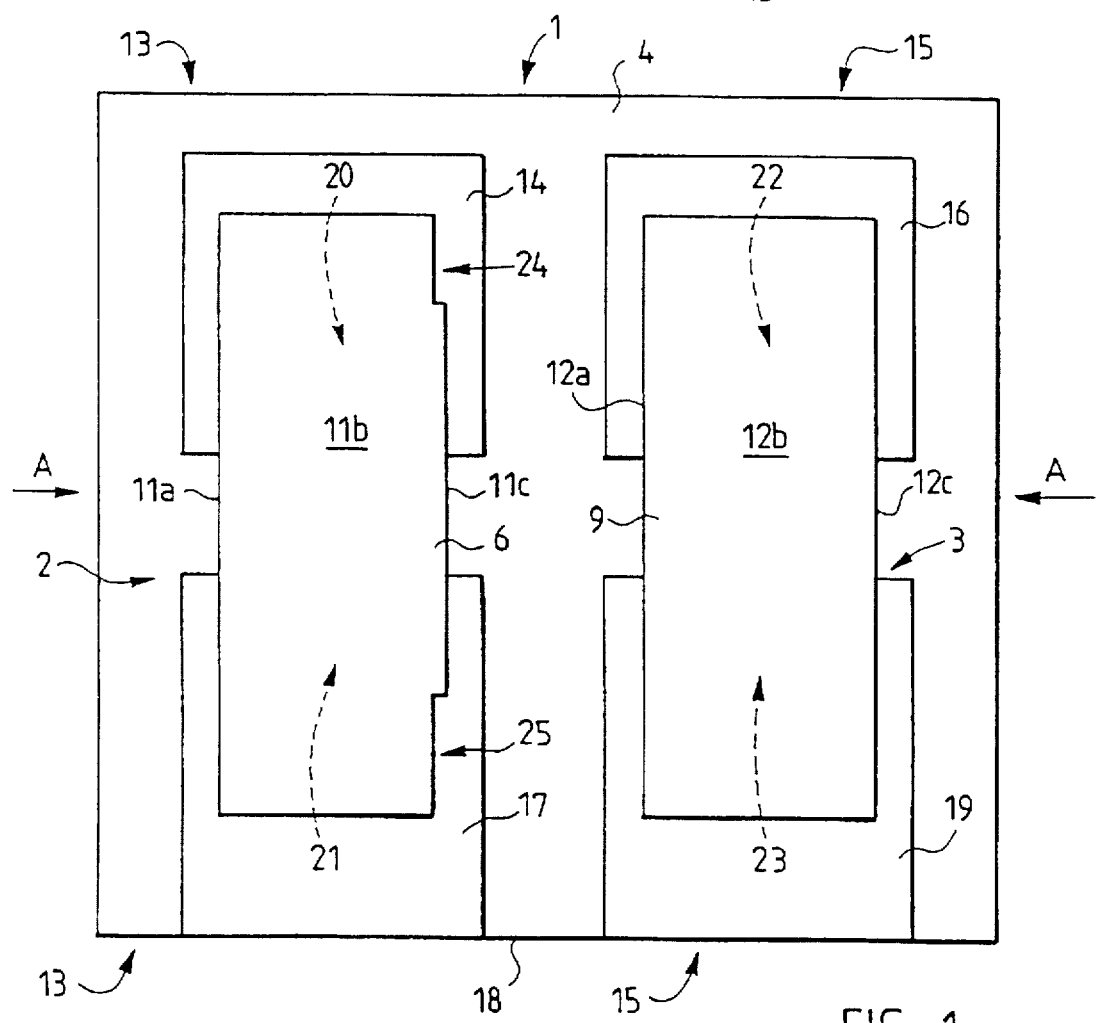
FIG. 1 is a top view of a resonator construction comprising two resonant circuits.
Figure 3:
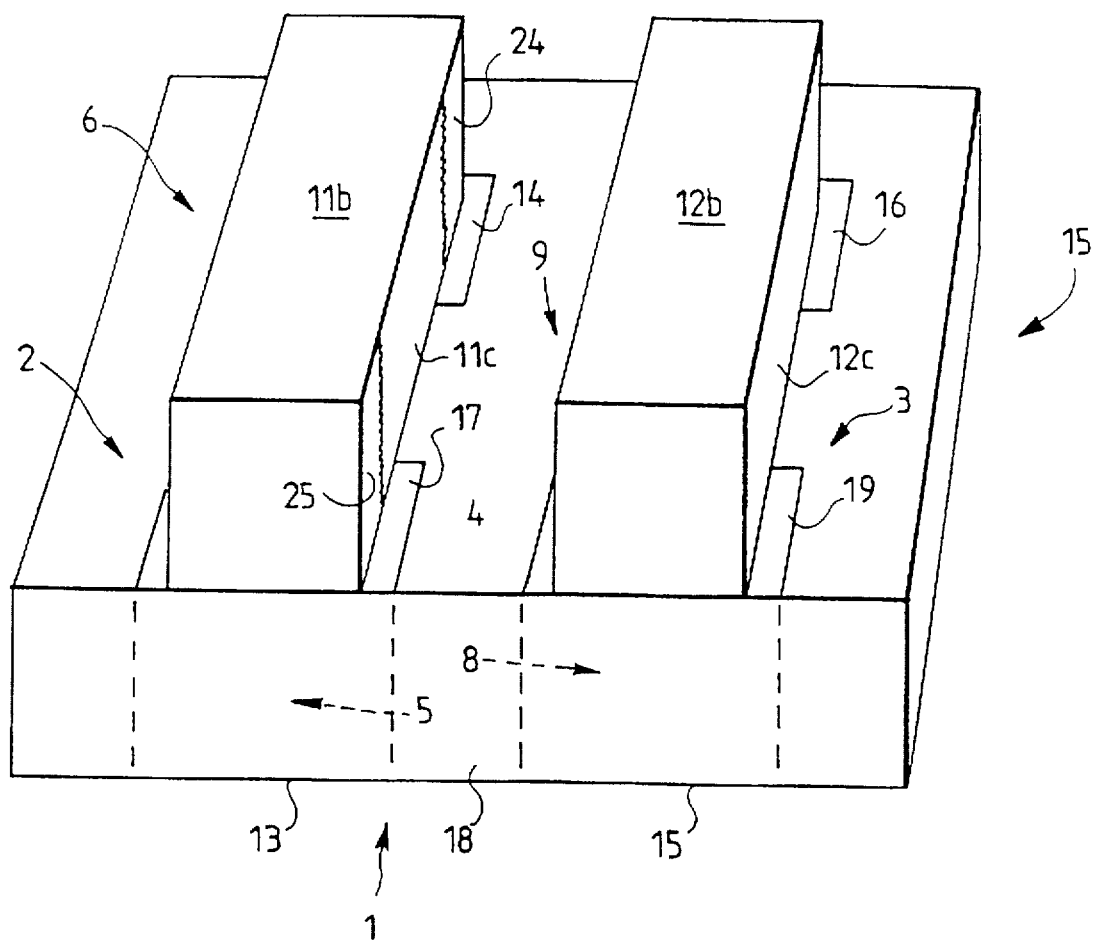
FIG. 3 shows a resonator construction comprising two resonant circuits.

The resonator construction 1 illustrated in FIGS. 1 to 3 comprises at least one, i.e. for example two, resonant circuits 2 and 3. The first resonator circuit 2 comprises preferably a ceramic substrate 4, or base plate, a first capacitance means 5, a first inductance means 6, comprising preferably a ceramic body 7. The second resonant circuit 3 comprises a second capacitance means 8 provided on the substrate 4, a second inductance means 9, comprising a second, preferably ceramic body 10. In accordance with FIGS. 1 to 3, the resonator construction 1 is preferably such that the same substrate 4 acts as the base plate for both the resonant circuits 2 and 3. In this connection it must be stated that the solution of the invention is also suitable for resonator constructions comprising one resonant circuit. There may thus be one or more resonant circuits and thus also one or more inductance and capacitance means. As is characteristic of a lumped-constant resonator, the capacitance means 5 and the inductance means 6 are clearly locatable separately, but they are operatively connected, i.e. connected in series. The capacitance means 8 and the inductance means 9 are connected in a corresponding manner.

FIGS. 1 to 3 thus illustrate the special characteristic of the lumped-constant resonator, i.e. that the inductance means and the capacitance means are separately locatable in the resonator construction. In accordance with the invention, the inductance means 6 of the resonant circuit 2 in the resonator construction 1 comprises a conductive coating 11, 11a-11d, provided on a bar-like, preferably ceramic body 7. Correspondingly, in the second resonant circuit 3, the inductance means 9 comprises a conductive coating 12, 12a-12d, provided on a bar-like, preferably ceramic body 10. The conductive coatings 11 and 12 are preferably of a metal, such as silver, copper or a corresponding material with high conductivity, and they are applied for instance by spray painting on the bar-like ceramic body 7 or 10 so as to make contact with it. A thin metallic coating 11 or 12, such as a layer of silver paint, is an embodiment which is easy to manufacture. Coating inductance 11, 11a-11d, on body 7, and coating inductance 12, 12a-12d, on body 10 extend in the longitudinal direction of each bar as a substantially equally thick coating which covers substantially equal areas on the different surfaces of each bar. This ensures good inductance characteristics, and makes the resonator easy to manufacture and to adjust.

The resonator construction of the invention thus comprises conductive coating inductances 11 and 12, between longitudinally opposite ends on elongated ceramic, i.e., non-conductive bodies 7 and 10, and capacitances 5, and 8, provided on a ceramic substrate 4.

From FIGS. 1 to 3 it can be seen that the bodies 7 and 10 of the inductance means are bar-like. The conductive coating 11, i.e., 11a-11d and the bar-like body 7 have at least one side, straight in cross section, and longitudinally planar, or curved in cross section and longitudinally planar The figures show several straight and planar surfaces 11a-11d belonging to the same entity. The construction is most preferably such that the inductance means 11, comprising a conductive coating on the bar-like body 7, has at least three coating areas 11a-11d, the adjacent coating areas being positioned at an angle with respect to each other. Inductance coating 12, 12a-12d, is correspondingly provided on its bar-like body. The coating areas 11a-11c and 12a-12c of the conductive coatings 11 and 12 are most preferably planar, and positioned adjacently and substantially at a right angle with respect to the adjacent conductor area(s); thus, for instance, the conductor area 11b in the middle is at a right angle with respect to conductor areas 11a and 11c. The shape of the ceramic body 7 or 10 of the inductance means located under the conductive coating 11 or 12 in practice corresponds to the shape of the conductive coating provided on top of it; the bodies 7 and 10 therefore comprise three planes located at an angle with respect to each other. This embodiment is easy to realize as regards both the bodies 7 and 10 and the metallic coatings, or conductor patterns 11a-11c and 12a-12c. Reference numerals 11d and 12d denote the conductive metallic coatings on the lower surfaces of the bodies 7 and 10; these surfaces are used for securing the inductance means to the substrate 4 in a manner which will be described below.

In addition to the inductance means, the lumped-constant resonator construction illustrated in FIGS. 1 to 3 comprises capacitance means, i.e. in practice capacitors 5 and 8. The capacitance means 5 of the first resonant circuit 2 comprises electrodes 13 and 14, and the part of the substrate 4 which acts as a medium between the electrodes 13 and 14. The capacitance means 5 is thus formed between electrodes 13 and 14 provided on opposite sides of the substrate 4. Correspondingly, the capacitance means 8 of the second resonant circuit 2 comprises electrodes 15 and 16, and the part of the substrate 4 which acts as a medium between the electrodes 15 and 16. The second capacitance means 8 is thus formed between electrodes 15 and 16 provided on opposite sides of the substrate 4. From FIGS. 1 and 2 it can be seen that the first electrodes of the capacitance means 5 and 8, i.e. the electrodes 13 and 15 to be connected to ground potential, are of the same electrode.

The substrate 4 comprises connection areas 14 and 17 for the first inductance means 6. The inductance means 6 of the first resonant circuit 2 is formed and positioned between the connection areas 14 and 17 provided on the same side of the substrate 4, the inductance means 6 and the capacitance means 5 being connected in parallel. The positive electrode 14 of the capacitance means 5 serves thus as a connection area for the inductance means 6, and that electrode 13 of the capacitance means 5 which is connected to ground potential is in a galvanic connection with the connection area 17 of the inductance means 6. The galvanic connection is formed by means of the metallic coating 18 at the end of the substrate as shown particularly in FIG. 3. Correspondingly, the substrate 4 comprises connection areas 16 and 19. The inductance means 9 of the second resonant circuit 3 is formed and positioned between the connection areas 16 and 19 provided on the same side of the substrate 4, the inductance means 9 and the capacitance means 8 being connected in parallel. The positive electrode 16 of the capacitance means 8 serves thus as a connection area for the inductance means 9, and that electrode 15 of the capacitance means 8 which is connected to ground potential is in a galvanic connection with the connection area 19 of the inductance means 9. The galvanic connection is formed through the metallic coating 18 at the end of the substrate as shown particularly in FIG. 3.

From FIGS. 1 to 3 it can be seen that the resonant circuit 2 of the resonator construction comprises joints 20 and 21 between inductance means 6 and connection areas 14 and 17 provided on the substrate. In a preferred embodiment, the body 7 of the inductance means 6 is secured to the substrate 4, to the connection areas 14 and 17 of the inductance means, directly through the conductive coating material provided on the inductance means 6. Correspondingly, the second resonant circuit 3 of the resonator construction comprises joints 22 and 23 between inductance means 9 and connection areas 16 and 19 provided on the substrate. In a preferred embodiment, the body 10 of the inductance means 9 is secured to the substrate 4, to the connection areas 16 and 19 of the inductance means, directly through the conductive coating material provided on the inductance means 9. In other words, the inductance means 6 and 9 with conductive metallic coatings provided on the ceramic bar-like bodies 7 and 10 are secured to the connection areas located on the ceramic substrate 4 by means of the same paste or layer of paint that forms the actual conductive metallic coating 11 and 12. The connection is effected by means of the coatings 11d and 12d on the lower surfaces of the bodies 7 and 10. In a preferred embodiment, the inductance means 6 and 9 provided on the bodies 7 and 10 are mounted on the connection areas while the conductive coating, such as paste or e.g. silver paint, applied on the body is still wet, whereafter the coatings 11 and 12 and thereby also the joints 20 to 23 are dried by efficient heating. A resistant joint with high conductivity is thus formed.

With reference to FIG. 3 in particular, the inductance means 6 comprises a means 24 for adjusting the resonance frequency of the resonant circuit 2 of the resonator construction. Said means for adjusting the resonance frequency of the resonator construction consists of area 24 on the surface of the body 7 of the inductance means 6; this area is not provided with the conductive coating 11a–11d. Thus the method of the invention for adjusting a lumped-constant resonator construction comprises altering the characteristics of one or more resonant circuits, e.g. resonant circuit 2, formed by one or more capacitance means, e.g. capacitance means 5, and inductance means 6 mounted on one or more substrates, e.g. substrate 4. The characteristics of the resonant circuit, e.g. circuit 2 or 3, are altered by adjusting the amount of the conductive coating, e.g. 11c, preferably the area of the conductive coating 11c, on the preferably ceramic body, e.g. body 7, of the inductance means, e.g. means 6. The amount of the conductive coating 11 can be adjusted during the manufacturing step, but preferably, however, only after the conductive coating 11 or 12 has dried.

Adjusting the resonant circuit refers to adjusting the resonance frequency and adjusting the coupling between adjacent resonant circuits.

According to the method, the resonance frequency of the resonant circuit 2 is adjusted by removing the conductive coating 11 provided on the preferably ceramic body 7 of the inductance means 6. The part of the inductance means 6 from which the conductive coating 11c has been removed is indicated by reference numeral 24, which in a way represents a means for adjusting the resonance frequency of the resonator construction. A corresponding area without the coating can also be provided on the coating 12 of the second resonant circuit 3 to allow the resonance of the second resonant circuit to be adjusted. The frequency of the resonant circuit can also be adjusted by removing the coating of the capacitance means.

When the resonator construction comprises more than one resonant circuits, e.g. two resonant circuits 2 and 3, it is necessary to adjust the coupling between the resonant circuits 2 and 3, which is effected through the electromagnetic field existing between the resonant circuits. The inductance means, e.g. the first inductance means 6, comprise a means 25 for adjusting the coupling between the resonant circuits 2 and 3. Said means 25 for adjusting the coupling between the resonant circuits 2 and 3 consists of area 25 on the surface of the body 7 of the inductance means 6; this area is not provided with the conductive coating 11a–11d. In order for the coupling to be adjustable, the area 25 without the conductive coating is provided on that part of the inductance means 6 which faces the adjacent, second inductance means 9. The method of the invention for adjusting a lumped-constant resonator construction comprises thus adjusting the coupling between the resonant circuits 2 and 3 by removing part of the conductive coating 11c applied on the preferably ceramic body 7 of the inductance means 6. An area 25 without the conductive coating is thus formed, which weakens the coupling between the resonant circuits 2 and 3.

In the lumped-constant resonator construction according to the invention, the areas without the conductive coating—i.e. area 24 for adjusting the resonance frequency of the resonator construction, and area 25 for adjusting the coupling between the resonant circuits 2 and 3—are formed at opposite ends of the body 7 of the inductance means 6. This means, in practice, that for adjusting the resonance frequency, the conductive coating on the body 7 of the inductance means 6 is removed at a different end of the inductance means 6 than when the coating is removed for adjusting the coupling between the resonant circuits 2 and 3, because this maximizes the effect of the adjustment. In practice, this means that the coupling between the resonators 2 and 3 is adjusted by removing the coating of the ceramic bar-like body at that end of the body which is to be connected to ground potential, i.e. by forming area 25. The resonance frequency of the resonant circuit 2, in turn, is adjusted by forming area 24 at the end to be connected to positive potential, i.e. at the end close to connection area 14, by adjusting the inductance. The areas 24 and 25 can be formed, i.e. the adjustment operations for removing the conductive coating can be performed, for instance by grinding.

Although the invention is described above with reference to the examples according to the accompanying drawings, it will be apparent that the invention is not restricted to these examples, but can be modified in many ways within the inventive concept disclosed in the appended claims.

We claim:

1. A lumped constant resonator comprising:

at least one non-conductive substrate having a surface;

at least one lumpedconstant capacitance means for capacitance through the substrate from a location on the surface; and at least one lumpedconstant inductance means for inductance, wherein the capacitance means and inductance means are located separately but operatively connected, and wherein the inductance means comprises a bar-like body mounted to the surface, elongated to extend longitudinally along the surface between opposite ends of the body and having a first area with a conductive coating extending between the opposite ends, a conductivity of the conductive coating being sufficiently more than a conductivity of the body for effective inductance means.

2. The lumped-constant resonator according to claim 1, wherein the bar-like body and first area are straight in cross section and longitudinally planar.

3. The lumped-constant resonator according to claim 1, wherein the bar-like body and first area are curved in cross section and longitudinally planar.

4. The lumped-constant resonator according to claim 1, wherein the inductance means further comprises at least second and third further areas having more of the conductive coating, the areas being adjacent and positioned at angles with respect to each other.

5. The lumped-constant resonator according to claim 1, wherein the conductive coating is metallic with a high conductivity.

6. The lumped-constant resonator according to claim 1, and further comprising means for setting a resonance frequency comprising an area on the body being free of a conductive coating.

7. The lumped-constant resonator according to claim 1, and further comprising:

second such capacitance means and inductance means, whereby to form two resonant circuits, wherein at least one of the inductance means comprises means for setting coupling between the resonant circuits consisting of an area on a surface of the body of at least a first one of the inductance means being free of a conductive coating and facing the second inductance means.

8. The lumped-constant resonator according to claim 7, and further comprising:

means for setting a resonance frequency consisting of an area on a surface of the body of the first inductance means being free of a conductive coating, wherein the areas free of the conductive coatings to set the resonance frequency and the coupling are at opposite ends of the body of the first inductance means, whereby to be associated with ground and positive potentials, respectively.

9. The lumped-constant resonator construction according to claim 1, wherein the capacitance means comprises an electrode at the location on the surface of the substrate and an electrode on an opposite side of the substrate, the inductance and capacitance means being electrically connected in parallel and the body of the inductance means is mounted to the body through the conductive coating and electrodes.

10. In a method for setting a characteristic of a lumped-constant resonator having one or more resonant circuits having lumped constant inductance means for inductance comprising a conductive coating on a bar-like body, the improvement wherein:

a characteristic of at least one of the resonant circuits is set by setting an amount of the conductive coating, and a conductivity of the conductive coating is sufficiently more than a conductivity of the body for effective lumped constant inductance means.

11. The method according to claim 10, wherein the characteristic is resonance frequency.

12. The method according to claim 11, wherein:

the lumped-constant resonator has more than one of the resonant circuits; and the resonance frequency is set with the amount of the conductive coating at one end of the body and the resonant circuits are coupled at an opposite end of the body.

13. The method according to claim 10, wherein:

the lumped-constant resonator has more than one of the resonant circuits; and the characteristic is coupling between the resonant circuits.

14. The method according to claim 13, wherein:

the lumped-constant resonator has more than one of the resonant circuits; and the resonance frequency is set with the amount of the conductive coating at one end of the body and the resonant circuits are coupled at an opposite end of the body.

* * * * *